United States Patent
Li et al.

(10) Patent No.: US 9,825,654 B2
(45) Date of Patent: Nov. 21, 2017

(54) DIGITAL FRONTEND SYSTEM FOR A RADIO TRANSMITTER AND A METHOD THEREOF

(71) Applicants: IMEC VZW, Leuven (BE); Katholieke Universiteit Leuven, KU LEUVEN R&D, Leuven (BE)

(72) Inventors: Chunshu Li, Qingdao (CN); Yanxiang Huang, Leuven (BE); André Bourdoux, Theux (BE)

(73) Assignees: IMEC VZW, Leuven (BE); KATHOLIEKE UNIVERSITEIT LEUVEN, KU LEUVEN R&D, Leuven (BE)

( * ) Notice: Subject to any disclaimer, the term of this patent is extended or adjusted under 35 U.S.C. 154(b) by 0 days.

(21) Appl. No.: 15/097,805

(22) Filed: Apr. 13, 2016

(65) Prior Publication Data
US 2016/0308559 A1  Oct. 20, 2016

(30) Foreign Application Priority Data
Apr. 16, 2015 (EP) ..................... 15163916

(51) Int. Cl.
| | |
|---|---|
| *H04B 1/04* | (2006.01) |
| *H04B 1/00* | (2006.01) |
| *H04L 27/36* | (2006.01) |

(52) U.S. Cl.
CPC ..... *H04B 1/0017* (2013.01); *H03F 2200/336* (2013.01); *H04B 1/0007* (2013.01); *H04B 2001/0425* (2013.01); *H04L 27/36* (2013.01); *H04L 27/367* (2013.01)

(58) Field of Classification Search
CPC ........................ H03F 2200/336; H04B 1/0007; H04L 27/36; H04L 27/367
See application file for complete search history.

(56) References Cited

U.S. PATENT DOCUMENTS

| | | | |
|---|---|---|---|
| 2005/0018790 A1* | 1/2005 | Liu ........................ | H04L 27/361 375/316 |
| 2006/0291589 A1* | 12/2006 | Eliezer ..................... | H03C 3/40 375/302 |
| 2009/0089540 A1* | 4/2009 | Hansen ............... | G06F 9/30014 712/29 |

(Continued)

OTHER PUBLICATIONS

Jung, In-Seok et al., "A CMOS Low-Power Digital Polar Modulator System Integration for WCDMA Transmitter", IEEE Transactions on Industrial Electronics, vol. 59, No. 2, Feb. 2012, pp. 1154-1160.

(Continued)

*Primary Examiner* — Ross Varndell
(74) *Attorney, Agent, or Firm* — McDonnell Boehnen Hulbert & Berghoff LLP

(57) ABSTRACT

The present disclosure relates to a digital frontend system for a radio device comprising a digital filter arranged for receiving digital quadrature signals and for filtering the digital quadrature signals and for outputting filtered quadrature signals; a conversion circuit arranged for receiving the filtered quadrature signals and for performing a rectangular to polar conversion of the filtered quadrature signals and for outputting a plurality of polar signals, characterized in that, the plurality of polar signals comprising an amplitude signal and quadrature phase signals.

14 Claims, 10 Drawing Sheets

(56) References Cited

U.S. PATENT DOCUMENTS

| | | | |
|---|---|---|---|
| 2009/0290631 A1* | 11/2009 | Lee .................. | H04B 1/662 |
| | | | 375/240 |
| 2010/0225419 A1* | 9/2010 | Pan .................. | H03H 15/02 |
| | | | 333/174 |
| 2012/0140685 A1* | 6/2012 | Lederer .............. | H04L 27/3854 |
| | | | 370/286 |

OTHER PUBLICATIONS

Chen, Chung-Chun et al., "Polar Transmitter for Wireless Communication System", Proceedings of the 2005 International Symposium on Intelligent Signal Processing and Communication Systems, Hong Kong, Dec. 13-16, 2005, pp. 613-616.

\* cited by examiner

DIGITAL FRONTEND SYSTEM FOR A RADIO TRANSMITTER AND A METHOD THEREOF

CROSS-REFERENCE TO RELATED APPLICATIONS

The present application is a non-provisional patent application claiming priority to European Patent Application No. EP 15163916.8 filed Apr. 16, 2015, the contents of which are hereby incorporated by reference.

FIELD OF THE DISCLOSURE

The present disclosure relates to radio transmitters and more specifically to a digital frontend system for polar radio transmitters.

BACKGROUND

The power amplifier (PA) is usually the most power hungry block in a wideband radio device, which typically operates at mm-wave frequency range, e.g. IEEE802.11ad standard at 60 GHz. In addition, phased array antennas are typically employed to overcome the high signal losses at this frequency range. However, the cost of the analog frontend systems increases in proportion to the number of antenna paths. This will drastically increase the power consumption, especially the share of the most power hungry PA. Improving the power efficiency of a radio transmitter is therefore critical in reducing the power cost of the wideband radio transmitters, which for example, are applied for high data rate short-range portable applications that require minimal power consumption for longer battery lifetime and high data rate backhaul systems that transmit with high output powers for longer range communication.

In such applications, in addition, most PAs operate in class-A linear mode due to the use of variable envelope modulations that are required for high data rates and high spectral efficiency. This causes the typical PA power efficiency of less than 5%, although records up to 30% could be achieved. In order to improve the PA power efficiency, the PA needs to work in its nonlinear region to utilize the peak efficiency. The radio employing a polar architecture is an approach that allows the PA to operate in saturation without the need for duplicating the signal path or using power combiners. In polar transmitters, the quadrature, I and Q, signals are converted to a phase (PH) and an amplitude (AM) signals, wherein the PH signal is used as input for the PA and AM is applied to the PA through a separate modulation path.

In conventional polar radio architectures, the conversion of quadrature to polar signals is typically done in radio frequency (RF) domain, wherein the amplitude (AM) signal is extracted from the RF modulated signal by an amplitude detection circuit, such as an envelope detector, operating at RF frequency. The phase signal is extracted by an RF limiter circuit, which introduces extra nonlinearity and bandwidth limitations. The phase signal is then fed to the input of the PA, while the amplitude signal is used to modulate the supply voltage of the PA. Such polar architectures, however, suffer from low power efficiency, high nonlinearity and bandwidth limitations. In recent papers, for example, the paper of In-Seok Jung, Yong-Bin Kim, "*A CMOS Low-Power Digital Polar Modulator System Integration for WCDMA Transmitter,*" IEEE Transactions on Industrial Electronics, vol. 59, no. 2, pp. 1154, 1160, Febuary 2012, and the paper of Chung-Chun Chen et. al., "*Polar transmitter for wireless communication system,*" Proceedings of 2005 International Symposium on Intelligent Signal Processing and Communication Systems, pp. 613, 616, 13-16 Dec. 2005, propose a digital polar modulator system employing a CORDIC processor for the conversion of the digital quadrature, in-phase (I) and quadrature (Q), signals into polar, i.e. amplitude and phase, signals. The phase signal is used to modulate a local oscillation signal. Thus, the conversion to polar signals is done in digital domain at baseband frequency instead of in analog domain at RF frequency.

Although employing a digital signal processor (DSP), such as a CORDIC processor, for the quadrature-to-polar conversion, the design of the digital frontend system of a polar radio for wideband applications, is still very challenging, as the digital front-end system has to work at a very high speed (e.g. at mm-waves in the range of GHz). This generates a bottleneck in the power budget in such polar transmitters where minimal power consumption and long battery lifetime is highly important. Power-efficient implementation of a digital frontend system is surely critical for wideband radio transmitters.

SUMMARY

The present disclosure aims at providing a power and area efficient digital frontend system for a polar transmitter device.

In a first aspect, the present disclosure relates to a digital frontend system for a radio device comprising: a digital filter arranged for receiving digital quadrature signals and for outputting filtered quadrature signals; a conversion circuit arranged for receiving the filtered quadrature signals and for performing a rectangular to polar conversion of the filtered quadrature signals and for outputting a plurality of polar signals, characterized in that the plurality of polar signals comprise an amplitude signal and quadrature phase signals.

In some embodiments, the conversion circuit comprises a vectoring-mode CORDIC processor and a rotation-mode CORDIC processor and each of them comprising two computational columns. The vectoring-mode CORDIC processor is arranged for receiving the filtered quadrature signals, and, for outputting the amplitude signal and a signal indicating a direction of rotation, $d_i$. The rotation-mode CORDIC processor is arranged for rotating an unit vector signal controlled by the signal indicative for a direction of rotation, $d_i$, and, for outputting the quadrature phase signals. Additionally, each computation column of each CORDIC processor comprises a plurality of computational circuits connected in series via a latch logic gate, thus forming a pipeline architecture, wherein each computation circuit is arranged to borrow computation time of a maximum of a half cycle of a clock signal. The latch logic gates form a data pipeline, wherein each latch logic gate is being arranged for receiving the clock signal for activating its operation and wherein each subsequent latch logic gate is arranged to be activated at an opposite signal level of the clock signal.

In other embodiments, the digital frontend system may further comprise a sampling circuit connected at the input of the digital filter and arranged for sampling the digital quadrature signals with an oversampling factor of 4 or more, and wherein the digital filter may comprise a set of first order FIR filters and a set of second-order FIR filters.

In further embodiments, the digital frontend system may further comprise a pre-distortion circuit arranged for pre-distorting the amplitude signal and the quadrature phase signals, and for outputting pre-distorted amplitude signal and pre-distorted quadrature phase signals.

In another aspect, the present disclosure relates to a method for a digital frontend system for a radio device, the method comprising the steps of: filtering digital quadrature signals and converting the filtered digital quadrature signals into a plurality of a plurality of polar signals, characterized in that, the plurality of polar signals comprise an amplitude signal and quadrature phase signals.

In some embodiments, the filtering is performed using a set of carry-save addition operations followed by a vectoring-merging operation. Additionally, the step of converting is performed iteratively, wherein the computation of each iteration is arrange to borrow computation time of a maximum of a half cycle of a clock signal.

In further embodiments, the method may further comprise a step of pre-distorting the amplitude signal and the quadrature signal to account for AM-AM and AM-PM distortions cause by the analog frontend system of the radio transmitter. In an example embodiment, the pre-distortion may be implemented using carry-save addition operations followed by a vector-merging operation.

In a second aspect, the present disclosure relates to a radio device comprising a digital frontend system according to the present disclosure. In some embodiments, the radio device may comprise a set of second order low-pass filters each arranged for filtering one of analog quadrature phase signals.

In a third aspect, the present disclosure relates to a communication network comprising a radio device according to the present disclosure.

DETAILED DESCRIPTION

Figure 1:
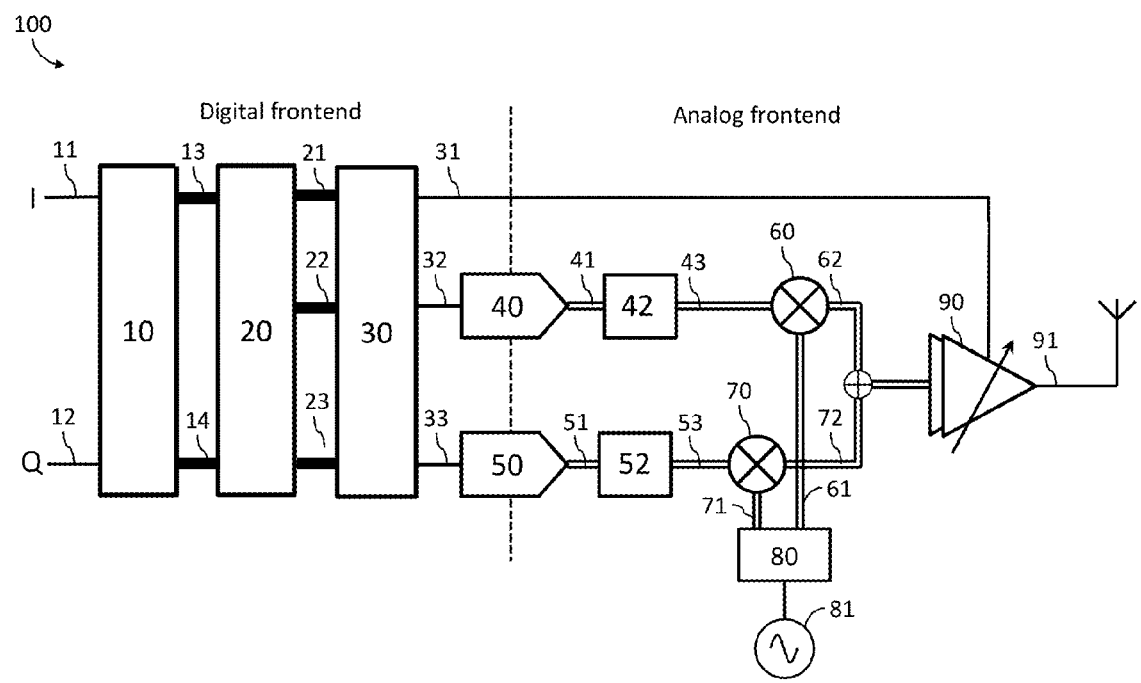
FIG. 1 illustrates a polar transmitter employing a digital frontend system according to the present disclosure.

The present disclosure will be described with respect to particular embodiments and with reference to certain drawings but the disclosure is not limited thereto. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Furthermore, the terms first, second, third and the like in the description and in the claims, are used for distinguishing between similar elements and not necessarily for describing a sequential or chronological order. The terms are interchangeable under appropriate circumstances and the embodiments of the disclosure can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the disclosure described herein can operate in other orientations than described or illustrated herein.

The term "comprising", used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting of only components A and B. It means that with respect to the present disclosure, the only relevant components of the device are A and B.

The present disclosure relates to a digital frontend system for a polar radio transmitter device. It capitalizes on the concept of expanding the polar implementation of the overall transmitter architecture into the digital domain as well, rather than only in analog domain.

FIG.1 illustrates a polar radio transmitter 100, comprising a digital frontend and an analog frontend system. The digital frontend system comprises a digital filter 10, a conversion circuit 20 and a pre-distortion circuit 30. The digital filter is arranged to receive at its input a digital quadrature signal, i.e. an I and Q signals, 11, 12, and to output a filtered quadrature signals 13, 14. The filtered signal 13, 14 are then fed to a conversion circuit 20 arranged for converting the baseband signal into a polar signal, i.e. into an AM signal 21, A(t), and quadrature PH signals 22, 23, being phase signals $\sin(\theta(t))$ and $\cos(\theta(t))$. The amplitude and the quadrature phase signals are then fed to the analog frontend system of the radio transmitter 100 via the pre-distortion circuit 30. The pre-distortion circuit 30 is arranged to pre-distort the polar signals to account for AM-AM and AM-PM distortions and to output pre-distorted amplitude 31 and phase signals 32, 33. AM-AM and AM-PM distortions are caused by variations in the voltage gain and the voltage-dependent capacitance of the active devices in an integrated circuit (IC). The pre-distortion circuit 30 thus in essence accounts for these variations in the amplitude signal 21 and the quadrature phase signals 22, 23 introduced by the active devices in the IC.

The pre-distorted polar signals 31, 32, 33 are then fed to the analog frontend system as described below. Each respective PH signal 32, 33 is converted to an analog PH signal 41, 51 by a digital-to-analog converter (DAC) 40, 50 followed by a low-pass filter 42, 52. The analog frontend comprises a plurality of mixers 60, 70, each arranged to receive a respective analog PH signal 43, 53 and a local oscillator signal 61, 71, and to generate a respective up-converted, to radio frequency, PH signals 62, 72. The up-converted PH signals 62, 72 are then summed and fed to the input of the power amplifier (PA) 90. The PA 90 comprises a number of amplifying unit cells connected in parallel. The phase signals 62, 72 are fed as input signals to the respective amplifying unit cells, while the pre-distorted amplitude signal 31 is used to directly control the operation of the PA by switching ON or OFF respective unit cells. As a result, by switching on, or by increasing the operational unit cells, the power of the signal at the output of the PA is controlled.

Each circuit of the proposed digital frontend system will be now explained in more details below.

To comply with the stringent requirements for wideband applications, e.g. IEEE802.11ad application, the quadrature signal 11, 12 has to be first sampled by a sampling circuit (not shown in the figures) and then digitally filtered by a digital filter 10. This is required as the transformation from quadrature signals to polar signals is non-linear and thus broadens the frequency spectrum. To avoid error vector magnitude (EVM) degradation due to the spectrum expansion which causes spectrum overlap among different transmit channels, the quadrature signals 11, 12 need to be first oversampled and then filtered before their conversion. The overall effect of the oversampling and the filtering shifts the first residual image-at a frequency offset equal to the sampling frequency of the sampling circuit. Thus, for a symbol rate of, e.g., 1760 Mega Symbols per second (Msps) in IEEE802.11ad application, an oversampling factor (OSF) of at least 6 is required to move the first residual image out of the RF band of IEEE802.11ad standard, which spans from 57 GHz to 66 GHz, and to meet the spectrum mask requirements. Although the residual image is moved out of the RF band, the digital filter 10 needs to operate at 1.76*6=10.56 Gsps. A filter operating at such frequencies is however very power consuming.

In one embodiment, a sampling circuit is provided at the input of the digital filter 10 and is arranged for sampling the digital quadrature signals 11, 12 with an oversampling factor (OSF) of 4 or more.

To achieve OSF of 4 and thus to reduce the power consumption, a filtering combination of a digital filter 10 and a second-order low-pass analog filter 42, 52 in the phase path is proposed. The proposed filter combination allows the usage of OSF of 4 to suppress the residual image below the spectrum mask. It has been found out that the passband width and filter order of the analog filter exhibit design tradeoff between the output EVM and residual image rejection ratio. That is, wider passband or smaller filter order keeps more significant signals in the transmission output, which leads to a better EVM. However, the residual image is less suppressed which may violate the spectrum mask requirements.

Figure 2:
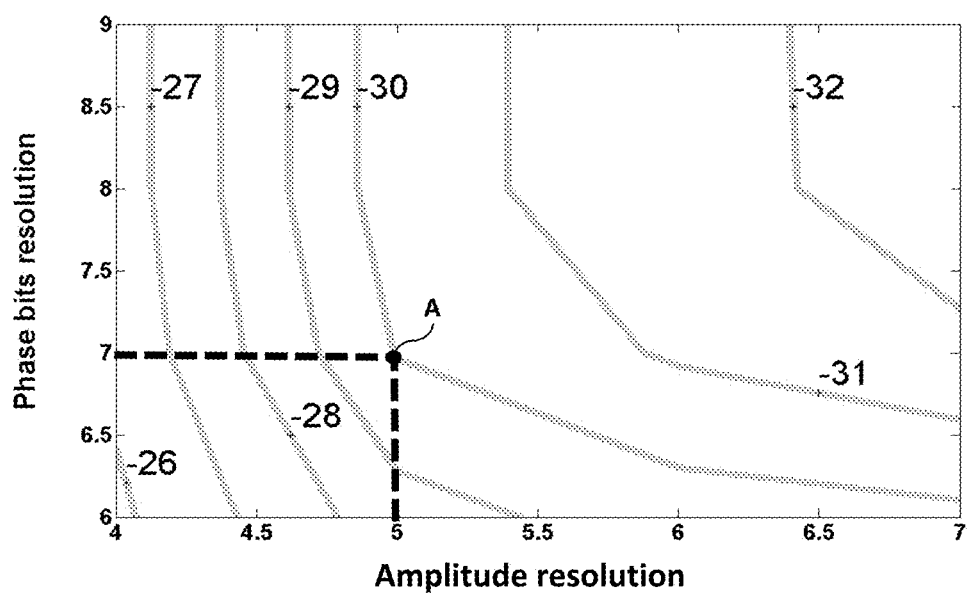
FIG. 2 illustrates the EVM results of the output signal of the polar transmitter shown in FIG. 1 in terms of the phase and amplitude resolution.

Experimental results are shown in Table 1 depicting the rejection ratio of the first residual image for different configurations for the OSF and the analog filter's cutoff frequency and order. It has been found, that a rejection of the residual image better that −30 dB can be achieved with an OSF of 4 and an analog filter passband width of 2 GHZ and order of 2. FIG. 2 presents simulation results for the EVM in terms of converted AM and PH (21, 22, 23) quantization accuracies (define by the number of bits representing the signal) with 1.) OSF of 4, 2.) input I/Q signals (11, 12) of 7 bits, and 3.) 2 GHz passband width of $2^{nd}$-order analog Butterworth filter.

TABLE 1

| OSF | Cutoff frequency of analog filter on phase path (GHz) | Analog filter order on phase path | First residual image attenuation (dB) |
| --- | --- | --- | --- |
| 4x | 2 | 2 | −33.12 |
| 4x | 2 | 4 | −33.41 |
| 6x | 2 | 2 | −36.76 |
| 6x | 2 | 4 | −36.92 |
| 8x | 2 | 2 | −39.39 |
| 8x | 2 | 4 | −39.45 |

Although there are multiple choices of quantization accuracies (as shown in FIG. 2) to achieve the −30 dB EVM requirement, some embodiments include selecting an AM signal with fewer bits to ease the routing of the digital AM bit-wires to the PA 90 in the layout design. For example at the turning corner, shown as point A in FIG. 2, a 5-bit AM and 7-bit PH signals give the best tradeoff between AM and PH quantization accuracies. Simulation with this quantization accuracy shows −30 dB suppression on the first residual image residing at 6.16 GHz.

Figure 3:
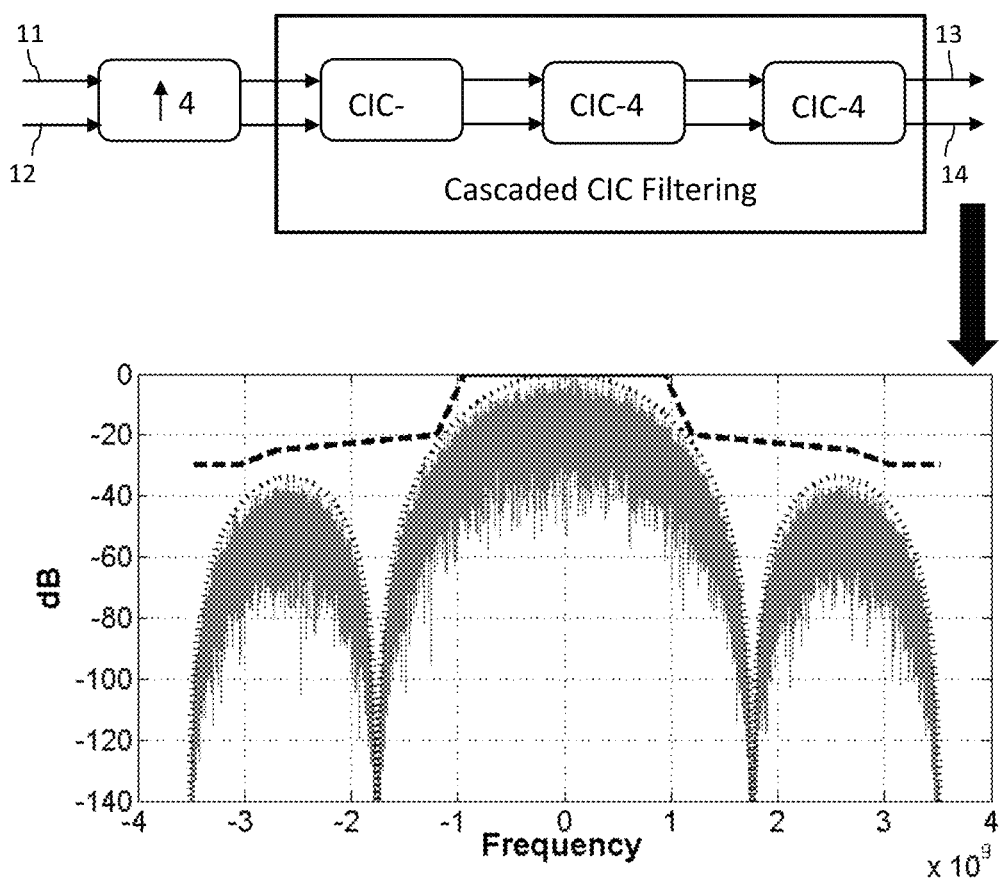
FIG. 3 depicts the signal spectrum filtered by three CIC-4 filters.
Figure 4:
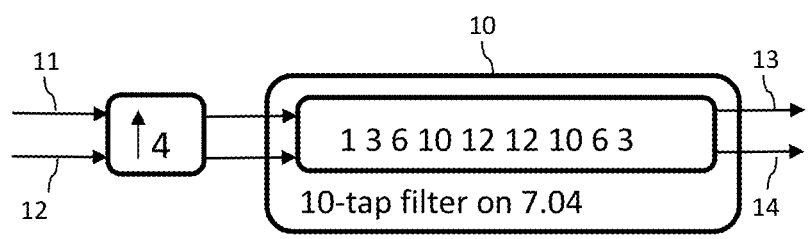
FIG. 4 illustrates the reference architecture of the three CIC-4 filters.

The function of the digital filter 10 is to shape the frequency spectrum of the quadrature signals so that the signal at the output of the filter is compliant with the spectrum mask requirements. FIG. 3 depicts the spectrum of the signal at the output of an example implementation of a digital filter 10 designed for wideband applications. The digital filter comprises three Cascaded Integrator-Comb (CIC) four-tap filters, of which the overall transfer function is shown in FIG. 4. Such filter implementation requires 9 adders and 10 multipliers, each operating at 7.04 Gsps, which is a very complex implementation having a high area footprint and high power consumption.

Figure 5:
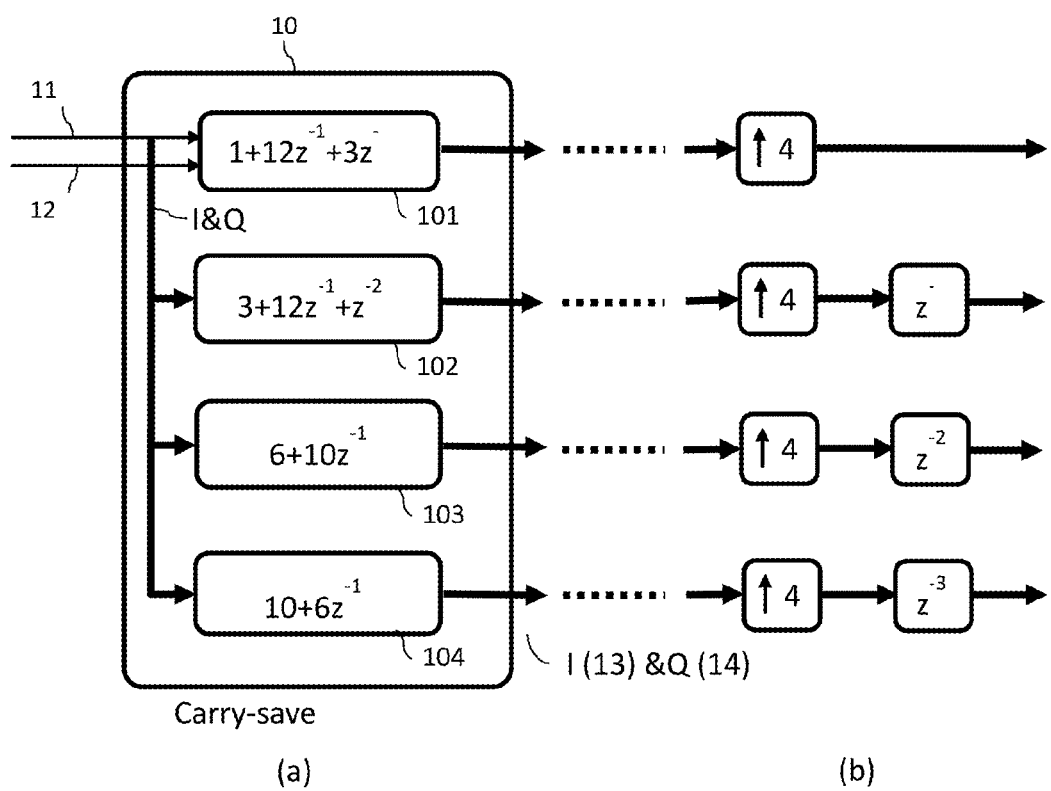
FIG. 5 illustrates a block scheme of an exemplary implementation of a digital filter according to the present disclosure.

FIG. 5(*a*) shows an exemplary implementation of the digital filter 10, according to the present disclosure, comprising a set of second-order FIR filters 101, 102 and a set of first-order FIR filters 103, 104 respectively. Each FIR filter is arranged to receive the oversampled digital quadrature signals 11, 12 and output a filtered quadrature signals. As a result, four sets of filtered quadrature signals are provided at the output of the digital filter 10, which are then processed further in the digital frontend circuit in four separate signal paths.

Preferably, the combination of the FIR filters is equivalent to a poly-phase representation of three CIC four-tap filters shown in FIG. 3. The transfer function of each of the FIR filter can be decomposed into a combination of two operations, i.e. an addition and a multiplication. In some embodiments, the multiplication can be further simplified to multiplications with binary values, the latter can be implemented in digital domain simply with left shift operations. As a result, the digital filter 10 can be implemented with a simple circuit comprising only of summation and left shift circuits, which significantly reduces the area and power footprint of the digital frontend system.

Additional power saving and speeding-up of the computation can be achieved by performing the addition operations using a carry-save arithmetic. The carry-save implementation requires in addition a vector-merging adder to perform the final summation of the coefficients. Each FIR filter 101, 102, 103, 104 is can be thus implemented using two pipelined computation circuits, i.e. the first computation circuit performing the carry-save addition and the second computation circuit implementing the vector-merging adder.

The output signals of the poly-phase FIR filters are then fed to the conversion circuit 20 and then to the pre-distortion circuit 30. After the pre-distortion circuit, at the very end of the digital frontend system, the signal paths are recombined, for example, as shown in FIG. 5(b). The implementation of the digital filter thus defines the number of signal paths of the digital frontend system.

The function of the conversion circuit 20 is to convert the filtered quadrature signal 13, 14 into an amplitude signal 21 and quadrature phase signals 22, 23. The conversion circuit thus performs a rectangular-to-polar conversion which can be mathematically computed from the Cartesian signals, i.e. an I and Q signal, as follows, $$A(t) = \sqrt{I(t)^2 + Q(t)^2},$$
$$\sin(\theta(t)) = \sin\left(\arctan\left(\frac{Q(t)}{I(t)}\right)\right),$$
$$\cos(\theta(t)) = \cos\left(\arctan\left(\frac{Q(t)}{I(t)}\right)\right),$$
(1)

The conversion equation involves multiple complex computations, such as square root, trigonometric and division computations. Power-efficient implementation of these complex computations is thus highly challenging as well. Typically, COordinate Rotation DIgital Computer (CORDIC) processor is used for these kinds of complex computations. The CORDIC processor is an iterative arithmetic processor, which can perform very efficiently transcendental functions, such as trigonometric, multiplication operations and other complex operations. The CORDIC processor can efficiently reduce the implementation complexity as it uses simple operations such as additions, bit-shifts and lookup tables (LUTs) instead of hardware multipliers.

Conventional, for polar conversion to calculate the AM and the PH signal, the CORDIC processor is operated in a vectoring mode. A conventional CORDIC processor requires three calculation columns for the polar conversion.

Figure 6:
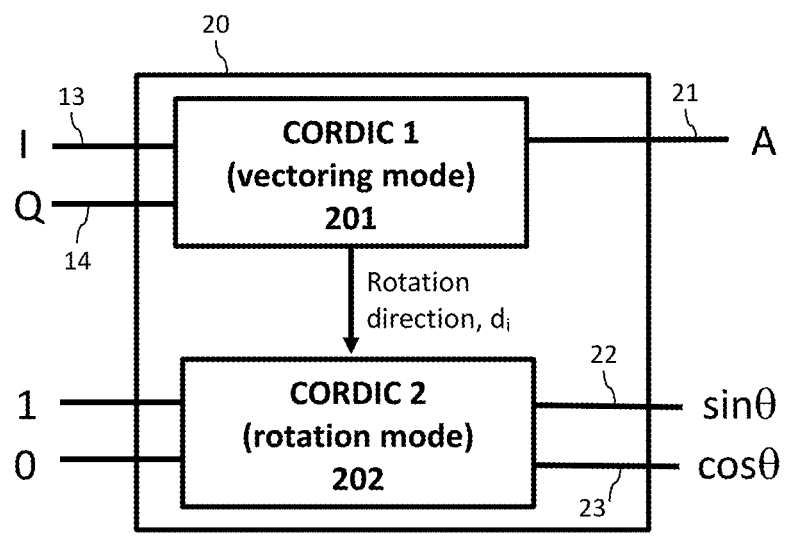
FIG. 6 illustrates a block scheme of an exemplary implementation of a conversion circuit according to the present disclosure.
Figure 7:
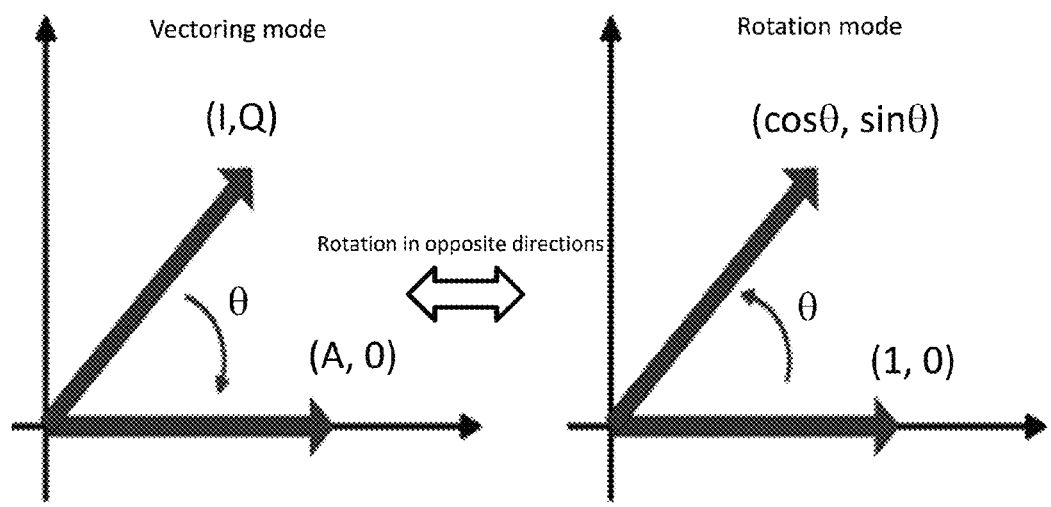
FIG. 7 illustrates the working principle of a vectoring-mode and a rotation-mode CORDIC processor according to the present disclosure.

FIG. 6 illustrates an exemplary block diagram of a conversion circuit 20 according to the present disclosure, comprising two CORDIC processors operating in parallel, the working principle of which is shown in FIG. 7. The first CORDIC processor 201 operates in vectoring mode and is arranged to receive at its inputs the filtered quadrature signals 13, 14 and to output an amplitude signal 21. The second CORDIC processor 202 operates in a rotation mode and is arranged to receive at its input pre-determined signals, a logical '1' and logical '0' signals, representing an unit vector with (1,0) spherical coordinates. Each CORDIC processor operates in an iterative manner and performs a number of rotations of the signal at its input with pre-determined angles of rotation $\phi$.

Figure 8:
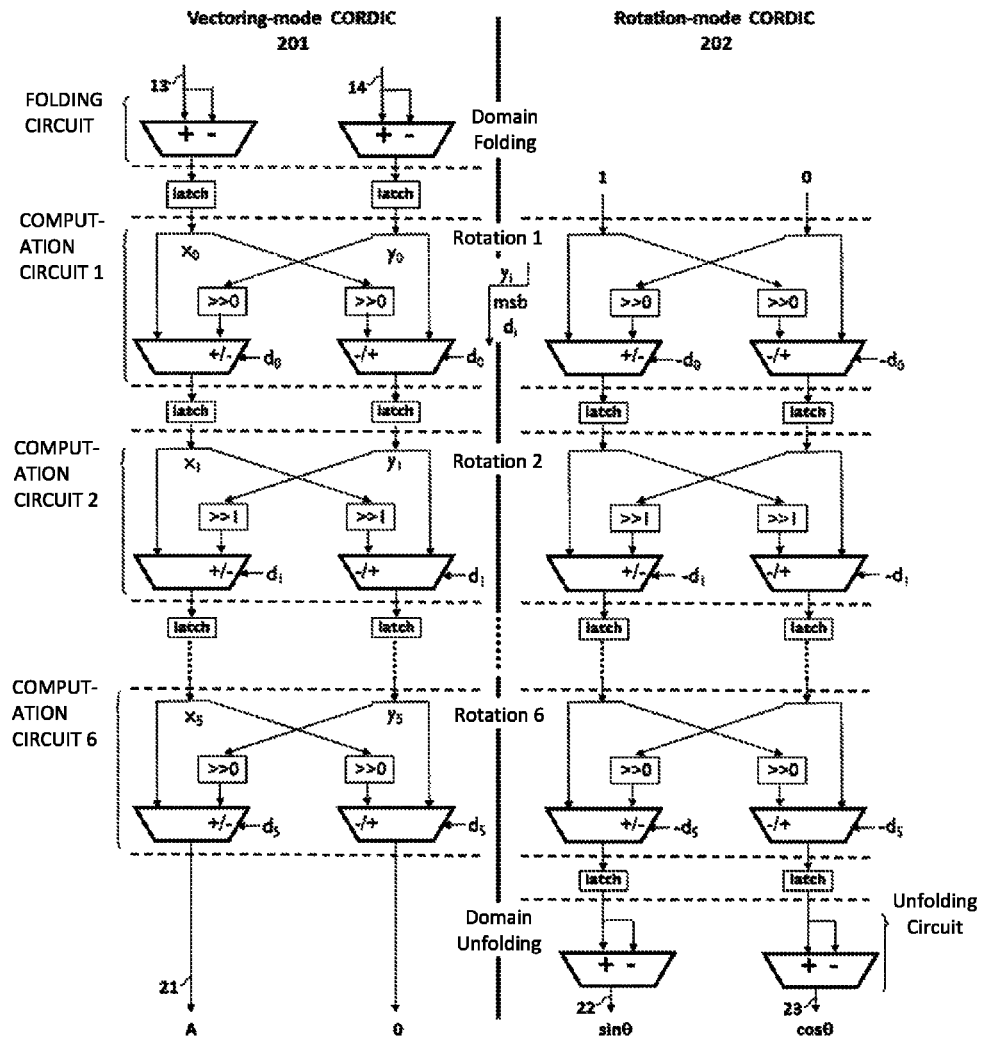
FIG. 8 illustrates an exemplary implementation of the conversion circuit according to the present disclosure.

FIG. 8 shows a more detailed scheme of the conversion circuit. The conversion circuit comprises in total four computation columns, the first 2 columns forming the vectoring-mode CORDIC 201 and the last two columns the rotation-mode CORDIC 202. Each computation column is characterized with a pipeline architecture, where the different pipeline stages are defined by the sequential logic circuits (e.g. a latch logic circuit) connecting the different stages to one another. Each computation column of the first CORDIC 201 (i.e. the first two computation columns) are provided with a folding circuit which is arranged to fold the respective input samples 13, 14 to the first domain, followed by a number of computation circuits each arranged to perform a single rotation with a predetermined angle of rotation $\phi_i$. The direction of the rotation is defined by the most significant bit, $d_i$, of the imaginary component, $\gamma_i$, of the rotated input vector sample. Thus, the first computation circuit rotates each respective sample 13, 14 with the same direction of rotation, $d_0$, the second computation circuit with a direction of rotation $d_1$, and so on. As shown in the figure, the vectoring-mode CORDIC comprises a folding circuit and six computation circuits connected to one another by a sequential logic circuit, such as a latch logic circuit.

Each computation column of the second CORDIC 202 (i.e. the last two computation columns) comprises the same number of computation circuits as the vectoring-mode CORDIC 201, followed by an unfolding circuit arranged to unfold the resulting quadrature PH signals 22, 23 to the correct domain. For example, if in the vectoring-mode CORDIC the input samples where folded from the second domain to the first domain, then in the rotation-mode CORDIC the output sample are unfolded from the first domain back to the second domain. Each computation circuit is arranged to perform a single rotation of its respective input signal with the same pre-determined rotation angle $\phi_i$ as in the vectoring-mode CORDIC 201. The angle of rotation $\phi$ in each respective computation circuit in both CORDIC processors 201, 202 at the same pipeline stage is the same, however, the direction of the rotation is opposite. In other words, whenever the vectoring-mode CORDIC rotates the input samples 13, 14 with a certain angle $\phi$, the rotation-mode CORDIC rotates the unit vector with the same angle $\phi$ but in an opposite direction. At the end of the conversion, the overall rotation angle $\phi = \Sigma_{i=1}^{n} \phi_i$ with which the unit vector is rotated is equivalent to the phase $\theta$ of the input signal. As a result, the vectoring-mode CORDIC will calculate a vector having (A, 0) spherical coordinates, while the rotation-mode CORDIC will calculate a vector with (sin $\theta$, cos $\theta$) spherical coordinates.

Figure 9:
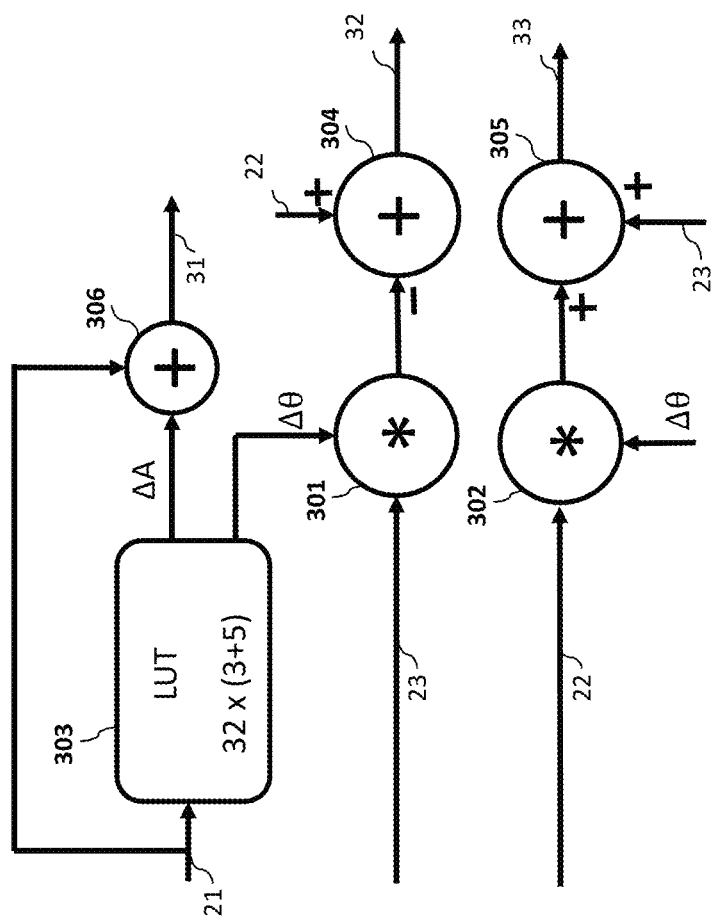
FIG. 9 illustrates an exemplary implementation of a pre-distortion circuit according to the present disclosure.

FIG. 9 shows an exemplary implementation of a pre-distortion circuit 30 according to the present disclosure. A pre-distortion circuit is necessary in case the PA's linearity is not sufficient enough. Although in a polar radio transmitter the PA can operate in saturation mode, which allows for high power efficiency, the PA may suffer from AM-AM and AM-PM nonlinearities. These nonlinearities cause spectral re-growth and devastate the constellation diagram.

As shown in the figure, the pre-distortion circuit 30 comprises of a set of multipliers 301, 302 each arranged to receive at one of its input one of the quadrature phase signals 22, 23 and at its other input a pre-distortion signal having a value of $\Delta\theta(t)$. The pre-distortion signal is derived from a look-up table (LUT) 303 based on the value of the AM signal 21. The value of the amplitude signal 21 is used as a single index to derive from the LUT two pre-distortion signals, the first one being a pre-distortion value for the phase signals 22, 23, i.e. $\Delta\theta(t)$, and a second one being a pre-distortion value for the AM signal 21, $\Delta A(t)$. The two pre-distortion signals share the same LUT entry. For example, for an entry with a given index, an 8-bit signal is derived, where the first 5 bits represent the $\Delta\theta(t)$ and the last 3 bits represent the $\Delta A(t)$. The pre-distorted AM signal 31 is created by summing the AM signal 21 with the value $\Delta A$ derived from the LUT. Similarly, the pre-distorted PH signals 32, 33 are created by operating on respective PH signal and the value $\Delta\theta(t)$ derived from the LUT, as shown in the figure.

The LUT 303 is indexed by the input amplitude A(t) signal 21. This is possible since the AM-AM and AM-PM responses of the PA depend only on the amplitude of the signal at its input. The pre-distortion circuit 30 computes the desired amplitude, A'(t), and quadrature phase, sin($\theta$'(t)) and cos(θ'(t)), outputs. The pre-distorted output can be represented as $Z(t)=A'(t)e^{j\theta'(t)}$. Since the input PH signals 22, 23 are in a quadrature form, i.e. sin(θ(t)) and cos(θ(t)), in practical implementations, the calculation of the pre-distorted phase, as shown in (2), is computationally intensive, which involves multiple complex trigonometric and multiple computations operating at oversampled throughput (e.g. 10.56 Gsps for OSF of 6)

$$\sin(\theta'(t))=\sin(\theta(t)+\Delta\theta(t))=\sin(\theta(t))\cos(\Delta\theta(t))+\cos(\theta(t))\sin(\Delta\theta(t))$$

$$\cos(\theta'(t))=\cos(\theta(t)+\Delta\theta(t))=\cos(\theta(t))\cos(\Delta\theta(t))-\sin(\theta(t))\sin(\Delta\theta(t)) \quad (2)$$

To avoid the usage of complex circuitry for the implementation of these complex trigonometric computation of the distortion phase Δθ in (2), the equation (2) is simplified using Taylor's approximation and considering the distorted phase Δθ is limited within 10 degrees, the equation (2) is simplified as follows:

$$\sin(\theta'(t))=\sin(\theta(t)+\Delta\theta(t))=\sin(\theta(t))\cos(\Delta\theta(t))+\cos(\theta(t))\sin(\Delta\theta(t))\approx\sin(\theta(t))+\cos(\theta(t))\Delta\theta(t).$$

$$\cos(\theta'(t))=\cos(\theta(t)+\Delta\theta(t))=\cos(\theta(t))\cos(\Delta\theta(t))-\sin(\theta(t))\sin(\Delta\theta(t))\approx\cos(\theta(t))-\sin(\theta(t))\Delta\theta(t). \quad (3)$$

Thus, the entries in the LUT can be limited to store the values of Δθ(t) and ΔA(t). In the example implementation shown in FIG. 9, the LUT contains 32 entries indexed by the input AM 21, with each entry containing 3 bits for distortion amplitude ΔA and 5 bits for Δθ(t). The pre-distorted AM signal 31 is created by summing the AM signal 21 with the value ΔA, while the pre-distorted PH signals 32, 33 are computed using the distortion phase Δθ(t) and as detailed in equation (3).

The pre-distortion circuit 30 may be provided with a supply voltage lower than the supply voltage applied to the other circuits of the digital frontend system. This allows to further reduce the power consumption. Additionally, the power supply to the pre-distortion circuit can be dynamically shut down when the PA in the polar transmitter offers sufficient linearity.

Figure 10:
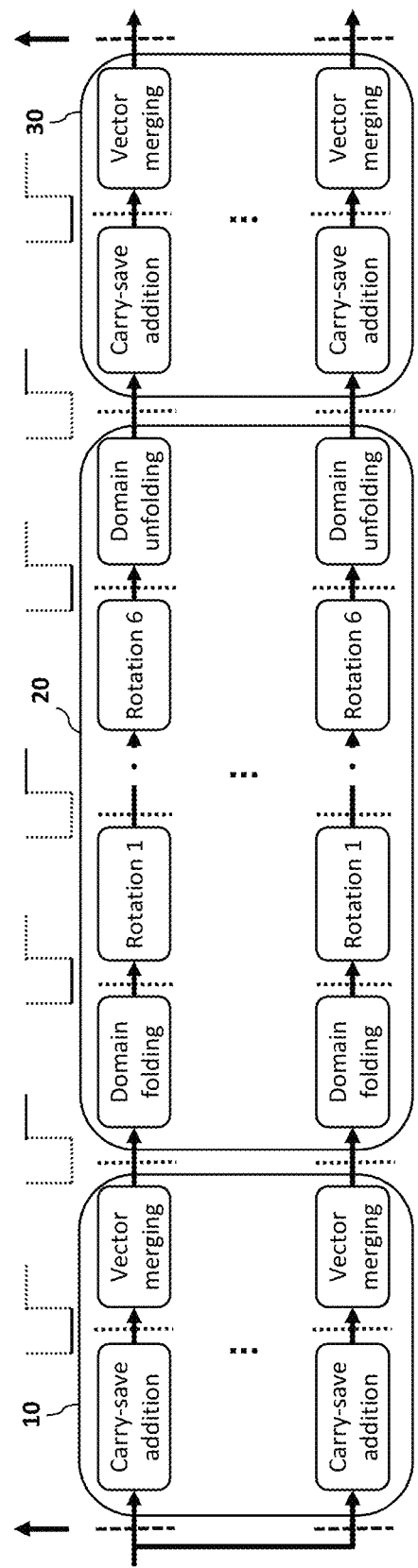
FIG. 10 illustrates a block scheme of a digital frontend system according to the present disclosure.

FIG. 10 shows an overall scheme of the pipeline architecture of the digital front-end system according to the present disclosure. As shown in the figure, the digital front-end system comprises four signal paths and each characterized with a pipeline architecture. As described above the number of the signal paths is defined by the implementation of the digital filter 10. Each stage of the pipeline is connected to the subsequent one via a sequential logic. To further reduce the area, power and timing costs of the sequential logics in the pipeline, level-triggered latches are chosen to realize the internal sequential logics. The location of the latch gates in the respective signal paths is indicated with a dotted vertical lines. To avoid the common hold-time failure problem in latch-based design, the adjacent latch elements are triggered at opposite levels of the clock signal. For example, the first latch in the pipeline is triggered at a low level of the clock signal, while the second latch is triggered at a high level of the clock signal. In an example embodiment, the proposed latch scheme operation allows for realizing a time borrowing approach. That is, the data from a computation stage can depart from a latch on the rising or falling edge of the clock signal, but does not have to set up until falling or rising edge of the clock signal on the receiving latch.

If a computation stage in the pipeline is a complex circuit and comprises complex logic elements, such as a CORDIC computation circuit, and the computation stage cannot performs its computation in one half clock cycle it can borrow time from the next half clock cycle or computation stage. Time borrowing can accumulate across computation stage. The attributes of the time borrowing principle are twofold and, in some embodiments, may be beneficial for a high-speed frontend system fabricated on deeply-scaled (28 nm) CMOS technology.

Firstly, the opportunistic time borrowing principle allows to account for process and environmental variations. Due to such variations, even if the pipeline is carefully equalized at design time, the delay of each computation stage can vary in the fabricated chip, the effect of which becomes even more severe with technology scaling. In the digital frontend system time borrowing allows for a slower computation stage to opportunistically borrow time from faster ones, which as a result allows for averaging out some of the variations.

Secondly, the time borrowing principle allows for a shorter design time because the stage-balancing can automatically take place as changes to the pipeline architecture can be avoided, for example changes as explicitly moving computation and or logic elements from one stage to another becomes unnecessary. This is especially beneficial for timing convergence for the example of a high-throughput wideband application, e.g., 1.76 Gsps for 802.11ad, pipeline with each stage under the timing constraint of a half clock cycle (3.52 GHz). Synthesis results show that, with allowed 10 ps time borrowing for each stage, the timing can easily converge.

Though the digital frontend system according to the present disclosure is described with reference to wideband application, it is appreciated that it can be readily applied to sub-6 GHz application, such as WCDMA etc. As the throughput is not that stringent the pipeline architecture can be simplified to use less pipeline stages.

The invention claimed is:

1. A digital frontend system for a radio device comprising:
  a digital filter arranged for receiving digital quadrature signals and for filtering the digital quadrature signals and for outputting filtered quadrature signals; and
  a conversion circuit arranged for receiving the filtered quadrature signals and for performing a rectangular to polar conversion of the filtered quadrature signals and for outputting a plurality of polar signals, wherein the plurality of polar signals comprises an amplitude signal and quadrature phase signals, wherein the quadrature phase signals are cos(θ(t) and sin(θ(t), wherein the conversion circuit comprises a vectoring-mode coordinate rotation digital computer (CORDIC) processor and a rotation-mode CORDIC processor, wherein each CORDIC processor comprises two computational columns, wherein each computation column of each CORDIC processor comprises a plurality of computational circuits connected in series via a respective plurality of latch logic gates, wherein rotation of each of the plurality of computational circuits of the rotation-mode CORDIC processor is based on output signals of each of the plurality of computational circuits of the vectoring-mode CORDIC processor, and wherein the output signals comprise information indicative of a direction of rotation.

2. The digital frontend system for a radio device as in claim 1, wherein the vectoring-mode CORDIC processor is arranged for receiving the filtered quadrature signals, and for outputting the amplitude signal and a signal indicating a direction of rotation.

3. The digital frontend system for a radio device as in claim 1, wherein the rotation-mode CORDIC processor is arranged for rotating a unit vector signal controlled by the direction of rotation, and, for outputting the quadrature phase signals.

4. The digital frontend system for a radio device as in claim 1, wherein each computation circuit is arranged to borrow computation time up to a maximum of a half cycle of a clock signal.

5. The digital frontend system for a radio device as in claim 4, wherein the plurality of latch logic gates form a data pipeline, each latch logic gate being arranged for receiving the clock signal for activating its operation and wherein each subsequent latch logic gate is being activated at an opposite signal level of the clock signal.

6. The digital frontend system for a radio device as in claim 1, further comprising a sampling circuit connected at an input of the digital filter and arranged for sampling the digital quadrature signals with an oversampling factor of 4 or more.

7. The digital frontend system for a radio device as in claim 1, wherein the digital filter comprises a set of first order finite impulse response (FIR) filters and a set of second-order FIR filters.

8. The digital frontend system for a radio device as in claim 1, further comprising a pre-distortion circuit arranged for pre-distorting the amplitude signal and the quadrature phase signals, and for outputting pre-distorted amplitude signal and pre-distorted quadrature phase signals.

9. The digital frontend system for a radio device as in claim 1, further comprising an analog front-end system, wherein the analog front-end system comprises a set of digital-to-analog converters arranged for converting digital quadrature phase signals into analog quadrature phase signals.

10. The radio device as in claim 9, further comprising a set of second order analog low-pass filters each arranged for filtering one of the analog quadrature phase signals.

11. A communication network comprising a radio device as in claim 9.

12. A method for a digital frontend system for a radio device comprising the steps of:

filtering digital quadrature signals and providing filtered digital quadrature signals, and converting, via a conversion circuit, the filtered digital quadrature signals into a plurality of polar signals, wherein the plurality of polar signals comprises an amplitude signal and quadrature phase signals, wherein the quadrature phase signals are $\cos(\theta(t))$ and $\sin(\theta(t))$, wherein the conversion circuit comprises a vectoring-mode coordinate rotation digital computer (CORDIC) processor and a rotation-mode CORDIC processor, wherein each CORDIC processor comprises two computational columns, wherein each computation column of each CORDIC processor comprises a plurality of computational circuits connected in series via a respective plurality of latch logic gates, wherein rotation of each of the plurality of computational circuits of the rotation-mode CORDIC processor is based on output signals of each of the plurality of computational circuits of the vectoring-mode CORDIC, and wherein the output signals comprise information indicative of a direction of rotation.

13. The method for a digital frontend system for a radio device as in claim 12, wherein the filtering is performed using a set of carry-save addition operations followed by a vector-merging operation.

14. The method for a digital frontend system for a radio device as in claim 12, wherein the conversion is performed iteratively, wherein a computation of each iteration is arranged to borrow computation time up to a maximum of a half cycle of a clock signal.

* * * * *